(12) United States Patent
Fujiwara et al.

(10) Patent No.: US 10,218,259 B2
(45) Date of Patent: Feb. 26, 2019

(54) POWER CONVERSION DEVICE

(71) Applicant: Mitsubishi Electric Corporation, Tokyo (JP)

(72) Inventors: Tetsuro Fujiwara, Tokyo (JP); Keita Takahashi, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 51 days.

(21) Appl. No.: 15/308,276

(22) PCT Filed: Aug. 22, 2014

(86) PCT No.: PCT/JP2014/072021
§ 371 (c)(1),
(2) Date: Nov. 1, 2016

(87) PCT Pub. No.: WO2016/027374
PCT Pub. Date: Feb. 25, 2016

(65) Prior Publication Data
US 2017/0063216 A1 Mar. 2, 2017

(51) Int. Cl.
*H02M 1/12* (2006.01)
*H03H 7/42* (2006.01)
*H03H 1/00* (2006.01)
*H02J 3/01* (2006.01)
*H02M 7/06* (2006.01)

(52) U.S. Cl.
CPC .............. *H02M 1/126* (2013.01); *H02J 3/01* (2013.01); *H02M 7/06* (2013.01); *H03H 1/0007* (2013.01); *H03H 7/427* (2013.01)

(58) Field of Classification Search
CPC ....... H03H 7/427; H03H 1/0007; H02M 7/06; H02M 1/126; H02J 3/01
USPC .................... 333/181, 262; 363/47
See application file for complete search history.

(56) References Cited

U.S. PATENT DOCUMENTS

2012/0275201 A1 11/2012 Koyama et al.

FOREIGN PATENT DOCUMENTS

| JP | 5-167376 A | 7/1993 |
|---|---|---|
| JP | 10-84669 A | 3/1998 |
| JP | 2011-147238 A | 7/2011 |
| JP | 2011-193593 A | 9/2011 |

OTHER PUBLICATIONS

International Search Report for PCT/JP2014/072021 dated Nov. 18, 2014.
"Chapter 10 EMC Design of IGBT Module", Fuji Electric Co., Ltd., May 31, 2011, 20 pages, XP055454947 [Retrieved from the Internet: URL:http://www.fujielectric.com/products/semiconductor/model/igbt/application/box/doc/pdf/RH984b/REH984b_10a.pdf].

(Continued)

*Primary Examiner* — Rakesh Patel
(74) *Attorney, Agent, or Firm* — Sughrue Mion, PLLC; Richard C. Turner

(57) ABSTRACT

In a power converter having a semiconductor switch, common-mode noise is effectively reduced by setting the common-mode inductance value of reactors which are inserted into both lines such that the resonance frequency of the combined capacity of a line-to-ground bypass capacitor and the reactors which are inserted into both lines becomes a predetermined value or more.

15 Claims, 6 Drawing Sheets

(56) References Cited

OTHER PUBLICATIONS

"EMC/EMI Filter Design with RB Common-Mode Chokes", Schaffner Group, Jul. 31, 2013, XP055454944, pp. 3-21 (22 pages), [Retrieved from the Internet: URL:https://www.schaffner.com/fileadmin/media/downloads/application_note/Schaffner_AN_RB_common_chokes.pdf].
Communication dated Mar. 12, 2018 from the European Patent Office in counterpart EP application No. 14900287.5.
Machine Translation of JP 05-167376 dated Jul. 2, 1993.
Communication dated Jul. 4, 2018, from the State Intellectual Property Office of People's Republic of China in counterpart Application No. 201480081255.3.

POWER CONVERSION DEVICE

CROSS REFERENCE TO RELATED APPLICATIONS

This application is a National Stage of International Application No.PCT/JP2014/072021 filed Aug. 22,2014, the content of which are incorporated herein by reference in their entirety.

BACKGROUND OF THE INVENTION

Field of the Invention

This invention relates to a power conversion device that performs power conversion by repeating an ON operation and an OFF operation of a semiconductor switch.

Description of the Related Art

In this type of power conversion device, since switching control is performed at a high-frequency switching frequency which is generally assumed to be 20 kHz or higher, high switching noise caused by an ON operation or an OFF operation of a switching element is generated. As a result, as a noise generation source, it may cause harm such as a malfunction or a shutdown of other electronic devices. In actuality, for such noise, since there is a need to ensure compatibility among standards of various countries, International Standard IEC (International Electrotechnical Commission) establishes and publishes EMC (Electromagnetic Compatibility) standards of electronic devices and automobile devices in various fields. In order to suppress such switching noise, generally, providing a noise countermeasures part may be possible, but this inevitably results in an increase in cost and an increase in the size of a device.

Thus, in the past, a method described in JP-A-2011-193593 (Patent Document 1), for example, has been proposed. That is, in accordance with the method proposed in Patent Document 1, common-mode noise is effectively reduced by inserting reactors in both of a line leading out of a power supply and a line returning to the power supply, and, as a result of a core being shared by the reactors which are inserted into both lines, since magnetic fluxes generated in both reactors are added to each other, it is possible to increase the inductance of the reactors and make the reactors smaller.

[Patent Document] JP-A-2011-193593

However, in accordance with the method proposed in Patent Document 1 described above, the capacity of a line-to-ground bypass capacitor connected between the line and the ground of a filter circuit and the common-mode inductance of the reactors which are inserted into both lines produce resonance, and the common-mode noise characteristics are deteriorated in a resonance frequency band. If the combined capacity of the line-to-ground bypass capacitor is assumed to be $C_1$ and the common-mode inductance of the reactors which are inserted into both lines is assumed to be $L_1$, a resonance frequency $f_r$ is expressed by Equation (1).

$$f_r = 1/2\pi\sqrt{(L_1 C_1)} \tag{1}$$

As the combined capacity of a line-to-ground bypass capacitor, the maximum capacity is determined from an admissible leakage current value and is generally about several dozen nF. Moreover, the inductance value of a reactor for energy accumulation, for example, is determined from an admissible ripple current and is a few hundred µH in a several-kw class power conversion device. Based on these facts, the resonance frequency by the capacity of the line-to-ground bypass capacitor and the common-mode inductance of the reactors which are inserted into both lines is about a few hundred kHz.

Here, in general, the Fourier spectral envelope of the voltage across a switching element such as an IGBT (Insulated Gate Bipolar Transistor) or a MOSFET (Metal-Oxide-Semiconductor Field-Effect Transistor) at the time of switching operation is expressed as that depicted in FIG. 5. T of FIG. 5 denotes a period, $f_0$ denotes a fundamental component of a switching frequency, $\tau$ is a pulse width, $t_r$ is a rise time, and $t_f$ is a fall time. As depicted in FIG. 5, the frequency of a harmonic component of $f_0$ which is higher than or equal to $f_1$ expressed by Equation (2) is the locus of the maximum amplitude, that is, the Fourier envelope attenuates at −20 dB/decade.

$$f_1 = 1/\pi\tau \tag{2}$$

As expressed by Equation (3), $f_2$ depicted in FIG. 5 depends on the rise time $t_r$, and, when the frequency becomes higher than or equal to $f_2$, the Fourier envelope becomes −40 dB/decade and the attenuation characteristics become further greater.

$$f_2 = 1/\pi t_r \tag{3}$$

The above description reveals that the attenuation of a harmonic component of a fundamental of a switching frequency becomes greater at a frequency higher than or equal to $f_2$. The rise/fall time of a switching operation of a recent IGBT, MOSFET, or the like is about a few hundred ns and $f_2$ at this time is a few MHz.

That is, in the technology proposed in Patent Document 1, since no consideration is given to the resonance produced by the capacity of the line-to-ground bypass capacitor and the reactors which are inserted into both lines and the resonance frequency $f_r$ thereof generally becomes a few hundred kHz and $f_r < f_2$, the common-mode noise characteristics are deteriorated in a band in which the attenuation of a harmonic component of a fundamental of a switching frequency is small. As a result, it is necessary to provide a noise countermeasures part such as a common-mode choke separately or improve the common-mode noise characteristics, which results in an increase in the size of a noise filter and an increase in cost.

SUMMARY OF THE INVENTION

This invention has been made in order to solve the above-described problem, and an object thereof is to provide a power conversion device that can effectively suppress switching noise without an increase in the size of a noise filter and an increase in cost by setting the common-mode inductance value of reactors such that the resonance frequency of the capacity of a line-to-ground bypass capacitor and the reactors which are inserted into both of a pair of lines becomes a predetermined value or more.

A power conversion device of a first invention is directed to a power conversion device including: a filter circuit having a line-to-ground bypass capacitor connected between a pair of lines and a ground; a switching circuit having a semiconductor switch; and reactors connected between the filter circuit and the switching circuit, in the power conversion device, the reactors are two reactors provided in both of the pair of lines, the two reactors sharing a core, and, if the combined capacity of the line-to-ground bypass capacitor is assumed to be $C_1$ [F], the common-mode inductance value of the two reactors is assumed to be $L_1$ [H], and a rise time of a voltage across a switch of the semiconductor switch is assumed to be $t_r$ [s], the common-mode inductance value of the two reactors is set such that a relationship $L_1 < t_r^2/4C_1$ is satisfied.

A power conversion device of a second invention is directed to a power conversion device including: a filter circuit having a line-to-ground bypass capacitor connected between a pair of lines and a ground; a switching circuit having a semiconductor switch; and reactors connected between the filter circuit and the switching circuit, in the power conversion device, the reactors are two reactors provided in both of the pair of lines, the two reactors sharing a core, and, if the combined capacity of the line-to-ground bypass capacitor is assumed to be $C_2$ [F] and the common-mode inductance value of the two reactors is assumed to be $L_2$ [H], the common-mode inductance value of the two reactors is set such that a relationship $L_2 < 1/\{(10\pi \times 10^6)^2 \times C_2\}$ is satisfied.

A power conversion device of a third invention is directed to a power conversion device including: a filter circuit having a line-to-ground bypass capacitor connected between a pair of lines and a ground; a switching circuit having a semiconductor switch; and reactors connected between the filter circuit and the switching circuit, in the power conversion device, the reactors are two reactors provided in both of the pair of lines, the two reactors sharing a core, and, if the combined capacity of the line-to-ground bypass capacitor is assumed to be $C_3$ [F] and the common-mode inductance value of the two reactors is assumed to be $L_3$ [H], the common-mode inductance value of the two reactors is set such that a relationship $L_3 < \{(10\pi \times 10^5)^2 \times C_3\}$ is satisfied.

According to the first invention, by inserting the reactors having the same inductance value into both of a pair of lines, since it is possible not only to reduce common-mode noise, but also to shift, by setting the common-mode inductance value of the reactors which are inserted into both lines at a value smaller than or equal to a predetermined value, the resonance frequency of the capacity of the line-to-ground bypass capacitor and the reactors which are inserted into both lines to a band in which the attenuation of a harmonic component of a fundamental of a switching frequency is great, there is no need to provide a countermeasures part such as a common-mode choke separately for reduction in noise which is increased in a resonance frequency band, which makes it possible to achieve a reduction in the size noise filter and a reduction in cost.

According to the second invention, by inserting the reactors having the same inductance value into both of a pair of lines, since it is possible not only to reduce common-mode noise, but also to shift, b by setting the common-mode inductance value of the reactors which are inserted into both lines at a value smaller than or equal to a predetermined value, the resonance frequency of the capacity of the line-to-ground bypass capacitor and the reactors which are inserted into both lines to 5 MHz or higher at which a conduction noise limit value defined in International Standard IEC increases, there is no need to provide a countermeasures part such as a common-mode choke separately for reduction in noise which is increased in a resonance frequency band, which makes it possible to keep conduction noise to a limit value or less while achieving a reduction in the size of a noise filter and a reduction in cost.

According to the third invention, by inserting the reactors having the same inductance value into both of a pair of lines, since it is possible not only to reduce common-mode noise, but also to shift, by setting the common-mode inductance value of the reactors which are inserted into both lines at a value smaller than or equal to a predetermined value, the resonance frequency of the capacity of the line-to-ground bypass capacitor and the reactors which are inserted into both lines to 500 kHz or higher at which a conduction noise limit value defined in international Standard IEC becomes constant and a harmonic component of a fundamental component f0 of a switching frequency attenuates at a slope of −20 dB/decade or −40 dB/decade while the limit value is constant, there is no need to provide a countermeasures part such as a common-mode choke separately for reduction in noise which is i-creased in a resonance frequency band, which makes it possible to keep conduction noise to a limit value or less while achieving a reduction in the size of a noise filter and a reduction in cost.

The foregoing and other objects, features, aspects and advantages of the present invention will become more apparent from the following detailed description of the present Invention when taken in conjunction with the accompanying drawings.

DETAILED DESCRIPTION OF THE PREFERRED EMBODIMENTS

Hereinafter, preferred embodiments of a power conversion device according to this invention will be described with reference to the drawings.

Embodiment 1.

Figure 1:
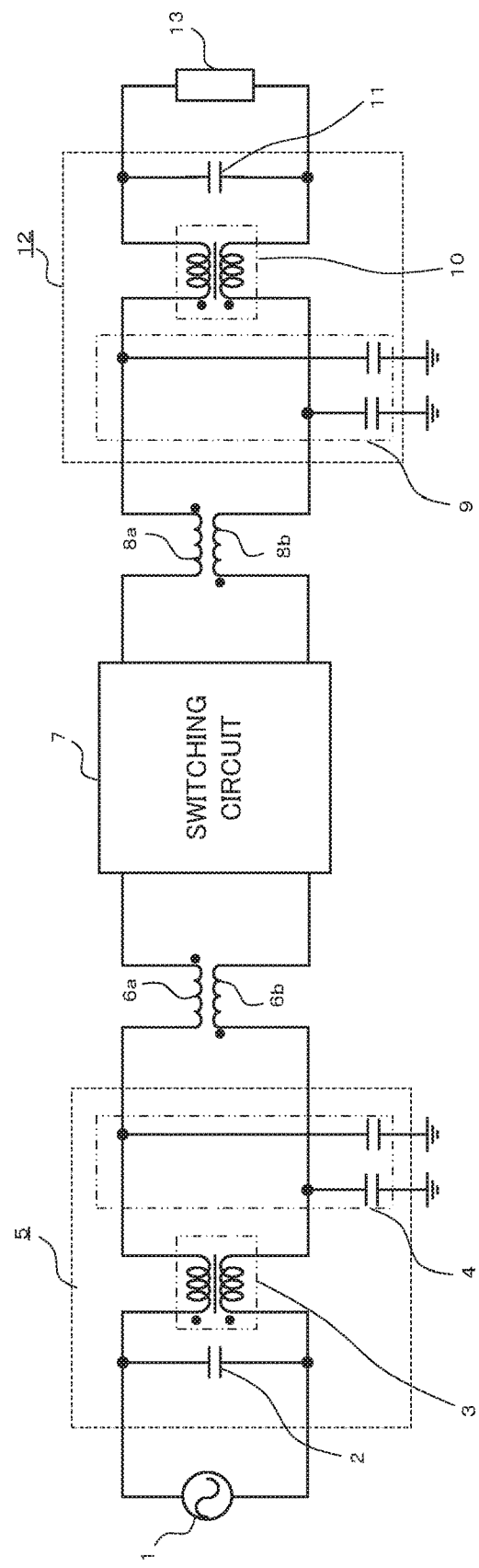
FIG. 1 is a diagram depicting the configuration of a power conversion device according to Embodiment 1 of this invention.

FIG. 1 is a schematic configuration diagram of a power conversion device according to Embodiment 1 of this invention. As depicted in FIG. 1, the power conversion device according to Embodiment 1 is formed of component elements from a component element that is connected to a commercial alternating-current input 1 as an alternating-current input power-supply to a component element that supplies power to a load 13. The commercial alternating-current input 1 is connected to a first noise filter 5 formed of a first inter-line bypass capacitor 2, a first common-mode choke 3, and a first line-to-ground bypass capacitor 4, and first reactors 6a and 6b sharing a core are connected to a pair of lines of an output of the first noise filter 5.

In a subsequent stage of the first reactors 6a and 6b, a switching circuit 7 having a semiconductor switch is connected, and second reactors 8a and 8b sharing a core are connected to a pair of lines of an output of the switching circuit 7. In a subsequent stage of the second reactors 8a and 8b, a second noise filter 12 formed of a second line-to-ground bypass capacitor 9, a second common-mode choke 10, and a second inter-line bypass capacitor 11 is connected, and the direct-current load 13 is connected to an output of the second noise filter 12.

An example of the operation of the switching circuit including the first reactors 6a and 6b and the second reactors 8a and 8b of the power conversion device connected in the above-described manner will be described with reference to FIGS. 2 and 3.

First, the operation of the switching circuit including the first reactors 6a and 6b of FIG. 1 will be described. FIG. 2 is a schematic configuration diagram depicting a state in which the first reactors 6a and 6b are applied to an AC/DC converter. Incidentally, the commercial alternating-current input 1, the first noise filter 5, the first inter-line bypass capacitor 2, the first common-mode choke 3, the first line-to-ground bypass capacitor 4, and the first reactors 6a and 6b are similar to those depicted in FIG. 1.

Figure 2:
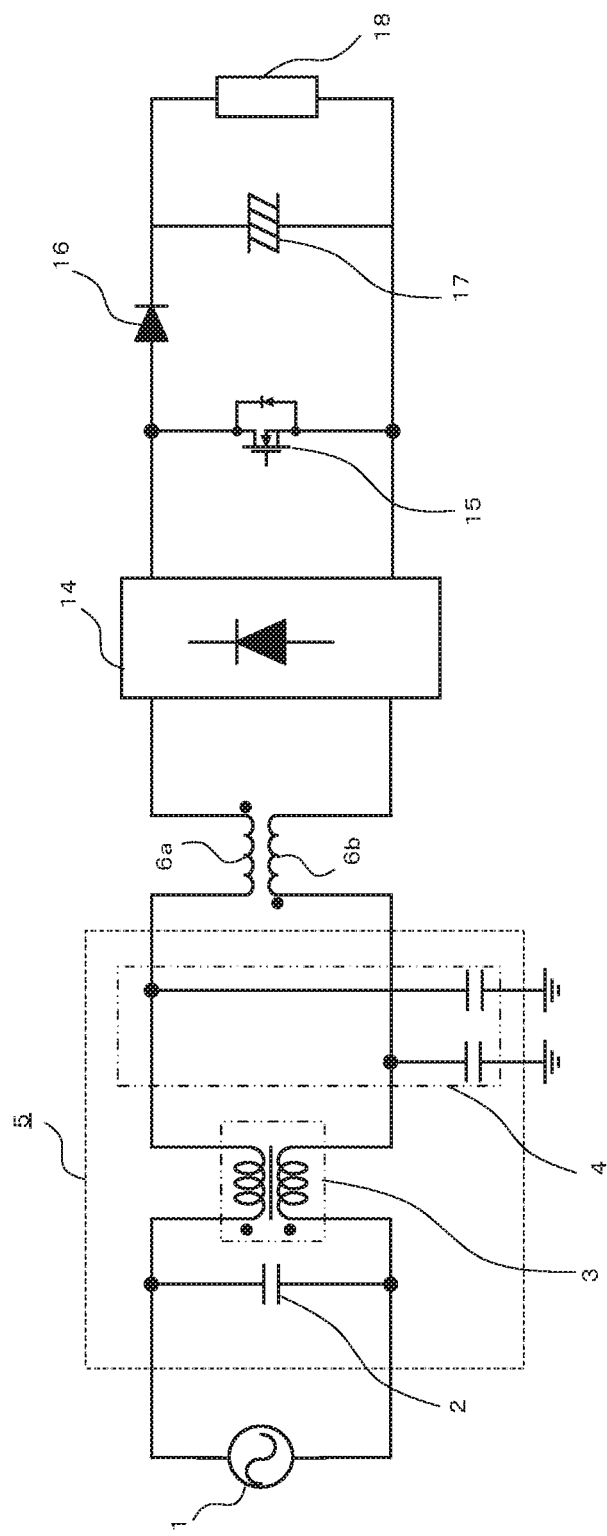
FIG. 2 is a diagram explaining an example of the operation of the power conversion device according to Embodiment 1 of this invention.

As depicted in FIG. 2, the first reactors 6a and 6b sharing a core are connected to a pair of lines of the output of the first noise filter 5, and a diode bridge 14 is connected to an output of the first reactors 6a and 6b. A switching element 15 and a diode 16 are connected in a subsequent stage of the diode bridge 14, and the cathode side of the diode 16 is connected to a positive electrode of a smoothing capacitor 17 in an output stage. To the other end of the switching element 15, the first reactor 6b and a negative electrode of the smoothing capacitor 17 are connected.

First, when the switching element 15 is turned on, a current flows through the first reactors 6a and 6b and energy is accumulated therein. Next, when the switching element 15 is turned off, the accumulated energy is transferred to a load 18 by a counter-electromotive force generated in the first reactors 6a and 6b. At this time, it is possible to control a power factor by controlling the pulse width of ON/OFF of the switching element 15 such that an input current waveform takes the form of a sinusoidal wave.

The switching circuit including the first reactors 6a and 6b is not limited to the circuit configuration of FIG. 2 and may be formed of another AC/DC converter circuit that performs power conversion by switching of an interleaved switching element, for example.

Next, the operation of the switching circuit including the second reactors 8a and 8b of FIG. 1 will be described. FIG. 3 is a schematic circuit diagram depicting a state in which the second reactors 8a and 8b are applied to a full-bridge DC/DC converter. Incidentally, the second reactors 8a and 8b, the second noise filter 12, the second line-to-ground bypass capacitor 9, the second common-mode choke 10, and the second inter-line bypass capacitor 11 are similar to those depicted in FIG. 1.

Figure 3:
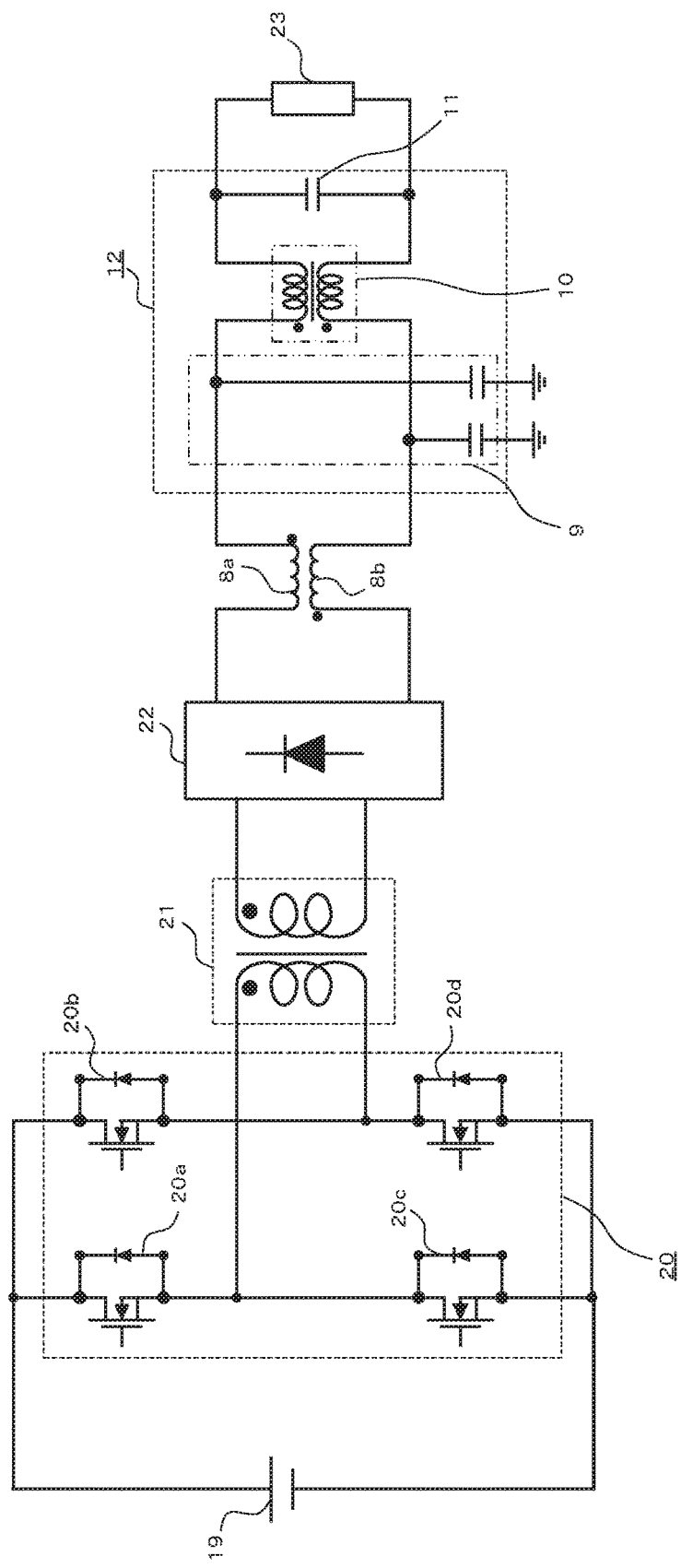
FIG. 3 is a diagram explaining another example of the operation of the power conversion device according to Embodiment 1 of this invention.

As depicted in FIG. 3, a direct-current power-supply input 19 is connected to a bridge circuit 20 formed of four switching elements 20a, 20b, 20c, and 20d, and the primary side of an isolating transformer 21 is connected to an output of the bridge circuit 20. A diode bridge 22 is connected to the secondary side of the isolating transformer 21, and the second reactors 8a and 8b sharing a core are connected to a pair of lines of an output of the diode bridge 22. In a subsequent stage of the second reactors 8a and 8b, the second noise filter 12 formed of the second line-to-ground bypass capacitor 9, the second common-mode choke 10, and the second inter-line bypass capacitor 11 is connected, and a direct-current load 23 connected to the output of the second noise filter 12.

A direct current of an input is converted into a high-frequency alternating current by alternately turning ON/OFF the four switching elements 20a, 20b, 20c, and 20d, a voltage is generated between the secondary-side terminals of the isolating transformer 21, and rectification is performed by the diode bridge 22. When a voltage is generated in the secondary side of the isolating transformer 21, energy is accumulated in the second reactors 8a and 8b; in other periods, the accumulated energy is transferred to the load 23 by a counter-electromotive force generated in the second reactors 8a and 8b. At this time, it is possible to control an output current by controlling the pulse width of ON/OFF of the switching elements 20a, 20b, 20c, and 20d.

The switching circuit including the second reactors 8a and 8b is not limited to the circuit configuration of FIG. 3 and may be formed of another DC/DC converter circuit that performs power conversion by switching of a half-bridge or flyback switching element, for example.

As described above, since the switching element forming the switching circuit 7 performs switching control at a high-frequency switching frequency which is assumed to be 20 kHz or higher, high switching noise caused by the switching frequency is generated. As the noise, there are two types of noise: common-mode noise and normal-mode noise. The common-mode noise is noise that is generally generated by a potential difference with a ground, and the normal-mode noise is noise that is generated by a potential difference between lines.

At this time, by inserting the first reactors 6a and 6b and the second reactors 8a and 8b having the same impedance into both lines, it is possible to reduce the common-mode noise as compared to a case in which insertion into only one line is performed.

The first reactors 6a and 6b will be taken up as an example; if the first reactors 6a and 6b are concentrated on only one line, there is the impedance of the first reactors 6a and 6b on the side of the line into which the first reactors 6a and 6b are inserted and there is no impedance by the reactors on the side of the line into which the reactors are not inserted.

As a result, on the side of the line into which the reactors are not inserted, noise directly flows into the ground via the line-to-ground bypass capacitor, but, on the side of the line into which the first reactors 6a and 6b are inserted, noise can be attenuated by the impedance of the first reactors 6a and 6b before the noise flows into the ground. As described above, as a result of an imbalance between the impedances of both lines, common-mode noise generated. Thus, by inserting the first reactors 6a and 6b having the same impedance into both lines, the impedances are equilibrated with each other, which makes it possible to reduce the common-mode noise.

Furthermore, by making the first reactors 6a and 6b, which are inserted into both lines, share a core, the magnetic fluxes generated in the first reactors 6a and 6b are added to each other in the direction in which a coil is wound, whereby it is possible to increase the total normal-mode inductance and make the first reactors 6a and 6b smaller.

In the above description, the first reactors 6a and 6b have been described; likewise, by making the second reactors 8a and 8b share a core, it is possible to make the second reactors 8a and 8b smaller.

Figure 4:
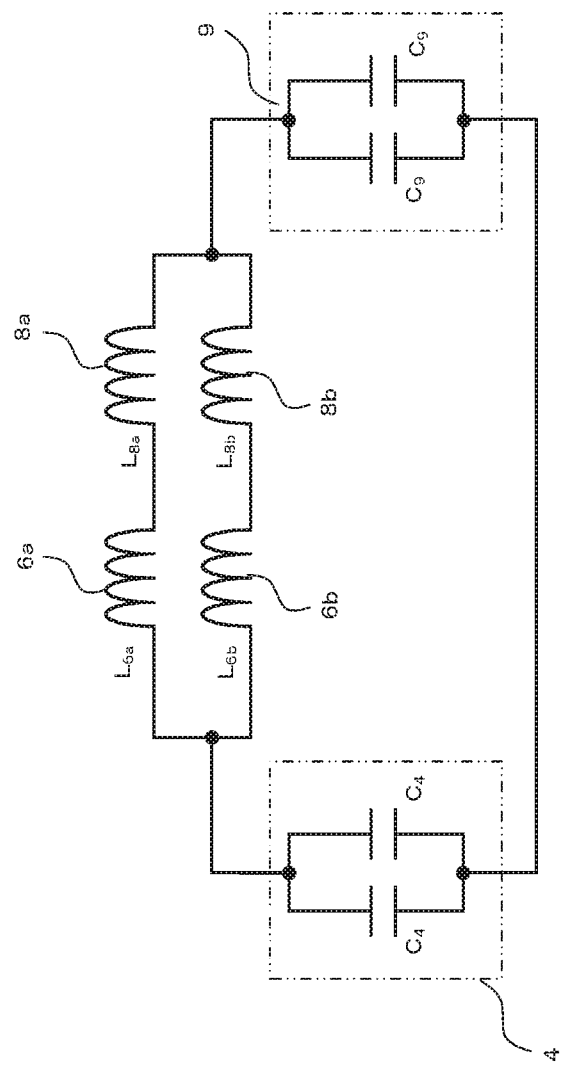
FIG. 4 is a diagram depicting an equivalent circuit model in which a common-mode noise resonance path of the power conversion device according to Embodiment 1 of this invention is simplified.

Next, a method of shifting the common-mode noise resonance frequency, which is the feature of this embodiment, will be described. In FIG. 4, an equivalent circuit model in which a common-mode noise resonance path formed of the first reactors 6a and 6b, the second reactors 8a and 8b, the first line-to-ground bypass capacitor 4, and the second line-to-ground bypass capacitor 9 of FIG. 1 is simplified is depicted.

As depicted in FIG. 4, the common-mode inductance value of the first reactors 6a and 6b is assumed to be $L_{common6}$, the common-mode inductance value of the second reactors 8a and 8b is assumed to be $L_{common8}$ the capacity of the first line-to-ground bypass capacitor 4 is assumed to be $C_4$, and the capacity of the second line-to-ground bypass capacitor 9 is assumed to be $C_9$.

A resonance frequency $f_{r1}$ formed in the resonance path depicted in FIG. 4 is expressed by Equation (4).

$$f_{r1} = 1/2\pi\sqrt{\{(L_{common6}+L_{common8})(C_4+C_9)\}} \qquad (4)$$

By making settings such that $f_{r1}$ of Equation (4) and $f_2$ of Equation (3) satisfy $f_{r1} \geq f_2$, it is possible to shift the common-mode noise resonance frequency to a band in which the attenuation of a harmonic component of a fundamental of a switching frequency is great and suppress common-mode noise in a resonance band.

By making smaller the common-mode inductance values $L_{common6}$ and $L_{common8}$ and the capacities $C_4$ and $C_9$ of the first and second line-to-ground bypass capacitors 4 and 9, it is possible to make settings such that $f_{r1} \geq f_2$ holds; however, if the capacities $C_4$ and $C_9$ of the first and second line-to-ground bypass capacitors 4 and 9 are made smaller, the common-mode noise reduction effect is reduced. On the other hand, as for the first reactors 6a and 6b and the second reactors 8a and 8b, by making the first reactors 6a and 6b share one core and the second reactors 8a and 8b share one core, since it is possible to make the magnetic fluxes in the core cancel each other out for a common-mode current, it is possible to reduce a common-mode inductance value while maintaining the common-mode noise reduction effect.

Therefore, the values of $L_{common6}$ and $L_{common8}$ are set as in Equation (5) such that $f_{r1} \geq f_2$ holds.

$$L_{common6}+L_{common8} < t_r^2/4(C_4+C_9) \qquad (5)$$

According to this embodiment, by inserting the reactors having the same inductance value into both of a pair of lines, since it is possible not only to reduce common-mode noise, but also to shift, b by setting the values of $L_{common6}$ and $L_{common8}$ as in Equation (5), the resonance frequency $f_{r1}$ of the capacity of the line-to-ground bypass capacitor and the reactors which are inserted into both lines to a band in which the attenuation of a harmonic component of a fundamental of a switching frequency is great, there no need to provide a countermeasures part such as a common-mode choke separately for reduction in noise which is increased in a resonance frequency band, which makes it possible to achieve a reduction in the size of a noise filter and a reduction in cost and effectively suppress common-mode noise.

Incidentally, in the above description, a case in which the reactors are connected to the input side and the output side of the switching circuit 7 has been described; however, even in a case in which the reactors are provided only on the input side of the switching circuit 7, by setting the common-mode inductance value of the reactors on the input side such that $f_{r1} \geq f_2$ holds, it is possible to suppress common-mode noise effectively. Moreover, even in a case in which the reactors are provided only on the output side of the switching circuit 7, by setting the common-mode inductance value of the reactors on the output side such that $f_{r1} \geq f_2$ holds, it is possible to suppress common-mode noise effectively.

Moreover, in FIG. 2, a configuration in which the first reactors 6a and 6b are connected in front of the diode bridge 14 is depicted, but a configuration in which the diode bridge 14 is connected in front of the first reactors 6a and 6b also makes it possible to obtain the effect similar to that of this embodiment.

The line-to-ground capacity of this embodiment has been described by using the first and second line-to-ground bypass capacitors 4 and 9, but a line-to-ground capacity formed by a wiring pattern of a pair of lines and the ground may be used.

Embodiment 2.

Next, a power conversion device according to Embodiment 2 of this invention will be described.

Figure 6:
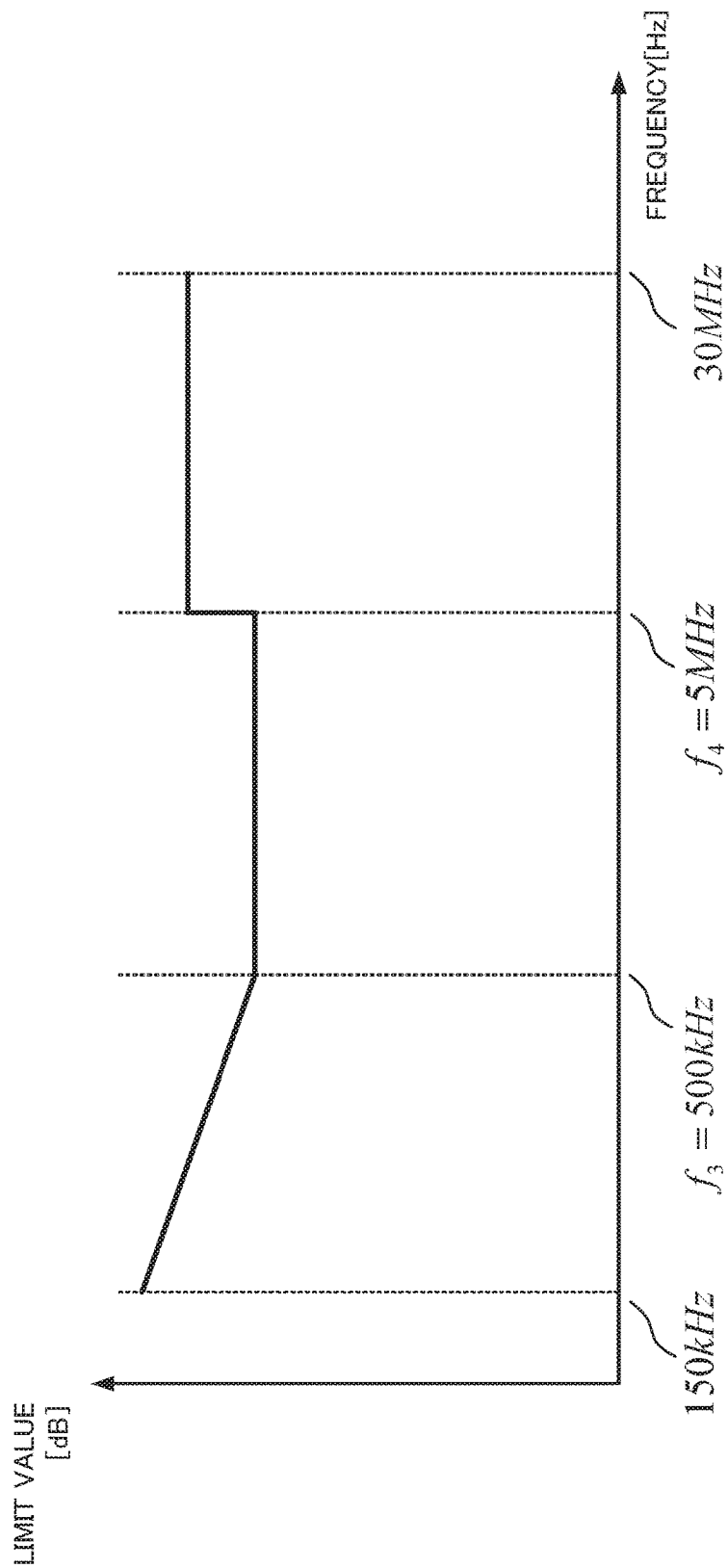
FIG. 6 is a diagram depicting a limit value defined in International Standard IEC61000-6-3 (second edition; 2006).

In Embodiment 1, the values of the common-mode inductances $L_{common6}$ and $L_{common8}$ of the first reactors 6a and 6b and the second reactors 8a and 8b are set such that the common-mode noise resonance frequency $f_{r1}$ formed in the first reactors 6a and 6b, the second reactors 8a and 8b, the first line-to-ground bypass capacitor 4 and the second line-to-ground bypass capacitor 9 satisfies $f_{r1} \geq f_2$; in Embodiment 2, the values of the common-mode inductances $L_{common6}$ and $L_{common8}$ of the first reactors 6a and 6b and the second reactors 8a and 8b are set such that the common-mode noise resonance frequency $f_{r1}$ becomes $f_4=5$ MHz or higher, $f_4$ at which a conduction noise limit value defined in International Standard IEC61000-6-3 (second edition; 2006) depicted in FIG. 6 is switched and increases.

In FIG. 6, a conduction noise limit value defined in International Standard IEC61000-6-3 (second edition; 2006) is depicted. In this type of power conversion device, it is necessary to keep conduction noise to a limit value depicted in FIG. 6 or less so as not to cause harm such as a malfunction or a shutdown of other electronic devices. As depicted in FIG. 6, the limit value gradually decreases until 500 kHz, the limit value becomes constant at 500 kHz or higher, and the limit value increases at 5 MHz or higher. Even when common-mode noise resonance occurs at 5 MHz or higher, since the limit value is high, it is possible to keep conduction noise to the limit value or less easily without providing a countermeasures part.

Therefore, the values of $L_{common6}$ and $L_{common8}$ are set as in Equation (6) such that $f_{r1} \geq f_4$ holds.

$$L_{common6}+L_{common8} < 1/\{(10\times10^6\pi)^2\times(C_4+C_9)\} \qquad (6)$$

According to this embodiment, by inserting the reactors having the same inductance value, into both of a pair of lines, since it is possible not only to reduce common-mode noise, but also to shift, by setting the values of $L_{common6}$ and $L_{common8}$ as in Equation (6), the resonance frequency $f_{r1}$ of the capacity of the line-to-ground bypass capacitor and the reactors which are inserted into both lines to 5 MHz or higher at which the conduction noise limit value increases, there is no need to provide a countermeasures part such as a common-mode choke separately for reduction in noise which is increased in a resonance frequency band, which makes it possible to keep conduction noise to a limit value or less while achieving a reduction in the size of a noise filter and a reduction in cost.

In the above description, a case in which the reactors are connected to the input side and the output side of the switching circuit 7 has been described; however, even in a case in which the reactors are provided only on the input side of the switching circuit 7, by setting the common-mode inductance value of the reactors on the input side such that $f_{r1} \geq f_4$ holds, it is possible to suppress common-mode noise effectively. Moreover, even in a case in which the reactors are provided only on the output side of the switching circuit 7, by setting the common-mode inductance value of the reactors on the output side such that $f_{r1} \geq f_4$ holds, it is possible to suppress common-mode noise effectively.

Incidentally, the line-to-ground capacity of this embodiment has been described by using the first and second line-to-ground bypass capacitors 4 and 9, but a line-to-ground capacity formed by a wiring pattern of a pair of lines and the ground may be used.

Moreover, in this embodiment, descriptions have been given by using the conduction noise limit value of IEC61000-6-3, but other standards, such as IEC61581-21, in which a conduction no limit value increases at 5 MHz may be used.

Embodiment 3.

Next, a power conversion device according to Embodiment 3 of this invention will be described.

The values of the common-mode inductances $L_{common6}$ and $L_{common8}$ of the first reactors 6a and 6b and the second reactors 8a and 8b are set such that the common-mode noise resonance frequency $f_{r1}$ formed in the first reactors 6a and 6b, the second reactors 8a and 8b, the first line-to-ground bypass capacitor 4, and the second line-to-ground bypass capacitor 9 satisfies $f_{r1} \geq f_2$ in Embodiment 1 and $f_{r1} \geq f_4$ in Embodiment 2; in Embodiment 3, the values of the common-mode inductances $L_{common6}$ and $L_{common8}$ of the first reactors 6a and 6b and the second reactors 8a and 8b are set such that the common-mode noise resonance frequency $f_{r1}$ becomes $f_3$=500 kHz or higher, $f_3$ at which a conduction noise limit value defined in International Standard IEC61000-6-3 (second edition; 2006) shown in FIG. 6 is switched and becomes constant.

Figure 5:
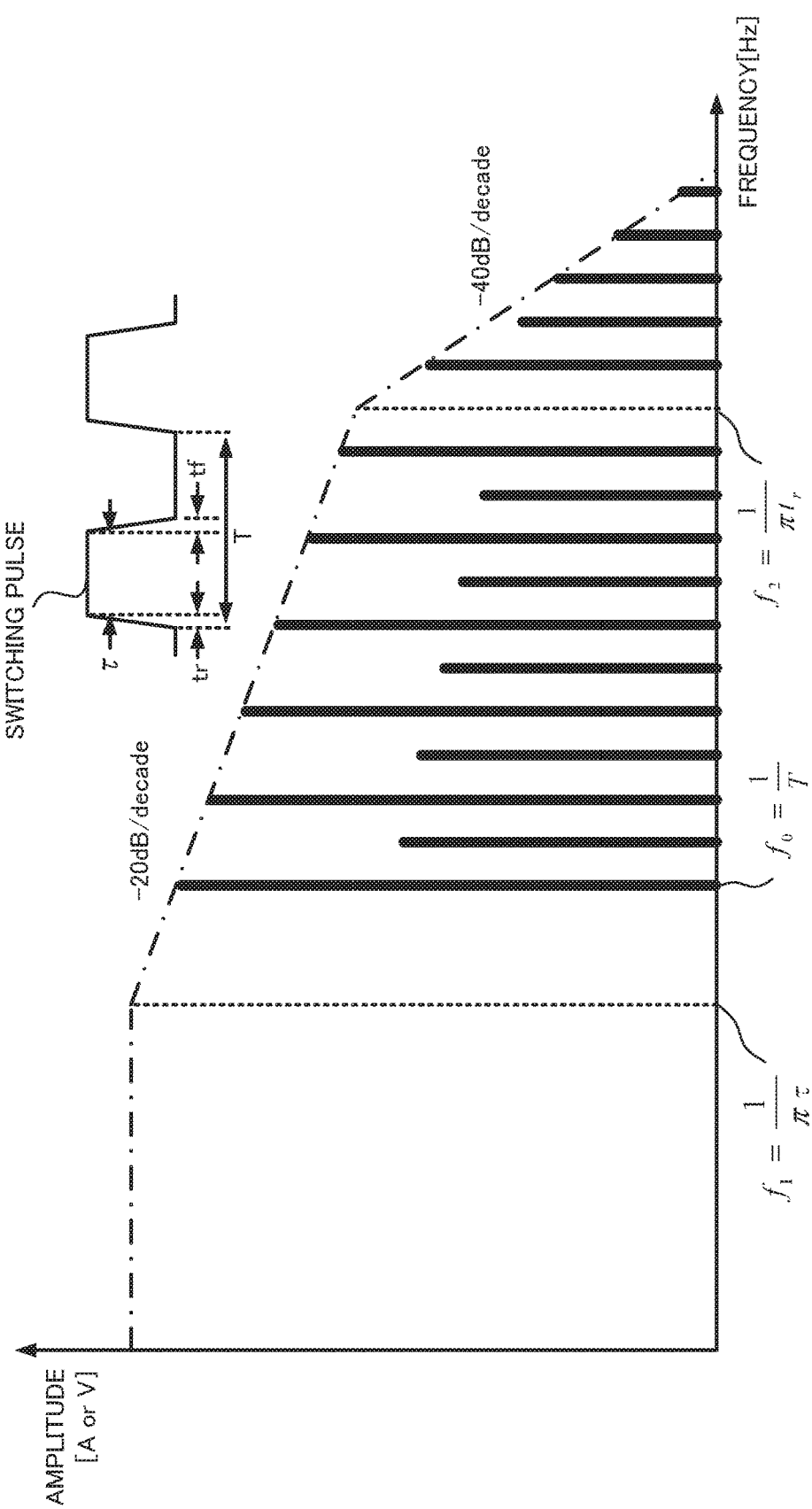
FIG. 5 is a diagram depicting the Fourier spectral envelope of a pulse at the time of switching operation.

As depicted in FIG. 5, the frequency of a harmonic component of a fundamental component $f_0$ of a switching frequency attenuates at a slope of −20 dB/decade or −40 dB/decade. Moreover, as depicted in FIG. 6, the conduction noise limit value becomes constant at a frequency of 500 kHz or higher. Even when common-mode noise resonance occurs at 500 kHz or higher, since the harmonic component of $f_0$ attenuates at a slope of −20 dB/decade or −40 dB/decade while the limit value is constant, it is possible to keep conduction noise to a limit value or less easily without providing a countermeasures part.

Therefore, the values of $L_{common6}$ and $L_{common8}$ are set as in Equation (7) such that $f_{r1} \geq f_3$ holds.

$$L_{common6} + L_{common8} < 1/\{(10 \times 10^5 \pi)^2 \times (C_4 + C_9)\} \quad (7)$$

According to this embodiment, by inserting the reactors having the same inductance value into both of a pair of lines, since it is possible not only to reduce common-mode noise, but also to shift, by setting the values of $L_{common6}$ and $L_{common8}$ as in Equation (7), the resonance frequency $f_{r1}$ of the capacity of the line-to-ground bypass capacitor and the reactors which are inserted into both lines to 500 kHz or higher at which the conduction noise limit value becomes constant and a harmonic component of a fundamental component $f_0$ of a switching frequency attenuates at a slope of −20 dB/decade or −40 dB/decade while the limit value is constant, there is no need to provide a countermeasures part such as a common-mode choke separately for reduction in noise which is increased in a resonance frequency band, which makes it possible to keep conduction noise to a limit value or less while achieving a reduction in the size of a noise filter and a reduction in cost.

In the above description, a case in which the reactors are connected to the input side and the output side of the switching circuit 7 has been described; however, even in a case in which the reactors are provided only on the input side of the switching circuit 7 and resonate with the line-to-ground capacitor, it is possible to suppress common-mode noise effectively. Moreover, even in a case in which the reactors are provided only on the output side of the switching circuit 7 and resonate with the line-to-ground capacitor, it is possible to suppress common-mode noise effectively.

The line-to-ground capacity of this embodiment has been described by using the first and second line-to-ground bypass capacitors 4 and 9, but a line-to-ground capacity formed by a wiring pattern of a pair of lines and the ground may be used.

Moreover, in this embodiment, descriptions have been given by using the conduction noise limit value of IEC61000-6-3, but other standards, such as IEC61581-21, in which a conduction noise limit value becomes constant at 500 kHz may be used.

While Embodiments 1 to 3 of this invention have been described, this invention allows the embodiments to be combined with each other or appropriately modified or omitted within the scope of the invention.

What is claimed is:

1. A power conversion device comprising:
   a filter circuit having a line-to-ground bypass capacitor connected between a pair of lines and a ground;
   a switching circuit having a semiconductor switch; and
   reactors connected between the filter circuit and the switching circuit,
   wherein the reactors are two reactors provided in both of the pair of lines, the two reactors sharing a core, and
   a common-mode inductance value $L_1$ of the two reactors is set such that a relationship $L_1 < t_r^2/4C_1$ is satisfied,
   wherein $C_1$ is a combined capacity of the line-to-ground bypass capacitor, and
   $t_r$ is a rise time of a voltage across a switch of the semiconductor switch.

2. The power conversion device according to claim 1, wherein the filter circuit and the two reactors are connected to an input side of the switching circuit.

3. The power conversion device according to claim 1, wherein the filter circuit and the two reactors are connected to an output side of the switching circuit.

4. The power conversion device according to claim 1, wherein the filter circuit and the two reactors are connected to an input side and an output side of the switching circuit.

5. The power conversion device according to claim 1, wherein the line-to-ground bypass capacitor is formed between a wiring pattern of the pair of lines and the ground.

6. A power conversion device comprising:
   a filter circuit having a line-to-ground bypass capacitor connected between a pair of lines and a ground;
   a switching circuit having a semiconductor switch; and
   reactors connected between the filter circuit and the switching circuit,
   wherein the reactors are two reactors provided in both of the pair of lines, the two reactors sharing a core, and
   a common-mode inductance value $L_2$ of the two reactors is set such that a relationship $L_2 < 1/\{(10\pi \times 10^6)^2 \times C_2\}$ is satisfied, $C_2$ being a combined capacity of the line-to-ground bypass capacitor.

7. The power conversion device according to claim 6, wherein the filter circuit and the two reactors are connected to an input side of the switching circuit.

8. The power conversion device according to claim 6, wherein the filter circuit and the two reactors are connected to an output side of the switching circuit.

9. The power conversion device according to claim 6, wherein the filter circuit and the two reactors are connected to an input side and an output side of the switching circuit.

10. The power conversion device according to claim 6, wherein the line-to-ground bypass capacitor is a formed between a wiring pattern of the pair of lines and the ground.

11. A power conversion device comprising:
a filter circuit having a line-to-ground bypass capacitor connected between a pair of lines and a ground;
a switching circuit having a semiconductor switch; and
reactors connected between the filter circuit and the switching circuit,
wherein the reactors are two reactors provided in both of the pair of lines, the two reactors sharing a core, and
if a common-mode inductance value $L_3$ of the two reactors is set such that a relationship $L_3<1/\{(10\pi\times10^5)^2\times C_3\}$ is satisfied, $C_3$ being a combined capacity of the line-to-ground bypass capacitor.

12. The power conversion device according to claim 11, wherein the filter circuit and the two reactors are connected to an output side of the switching circuit.

13. The power conversion device according to claim 11, wherein the filter circuit and the two reactors are connected to an input side of the switching circuit.

14. The power conversion device according to claim 11, wherein the filter circuit and the two reactors are connected to an input side and an output side of the switching circuit.

15. The power conversion device according to claim 11, wherein the line-to-ground bypass capacitor is a formed between a wiring pattern of the pair of lines and the ground.

* * * * *